US006433401B1

(12) United States Patent
Clark et al.

(10) Patent No.: US 6,433,401 B1
(45) Date of Patent: Aug. 13, 2002

(54) MICROFABRICATED STRUCTURES WITH TRENCH-ISOLATION USING BONDED-SUBSTRATES AND CAVITIES

(75) Inventors: William A. Clark, Fremont; Mark A. Lemkin; Thor N. Juneau, both of Berkeley; Allen W. Roessig, Fremont, all of CA (US)

(73) Assignee: Analog Devices IMI, Inc., Berkeley, CA (US)

( * ) Notice: Subject to any disclaimer, the term of this patent is extended or adjusted under 35 U.S.C. 154(b) by 0 days.

(21) Appl. No.: 09/543,936

(22) Filed: Apr. 5, 2000

Related U.S. Application Data

(60) Provisional application No. 60/127,973, filed on Apr. 6, 1999.

(51) Int. Cl.[7] .............................................. H01L 29/00
(52) U.S. Cl. ...................................... 257/524; 257/510
(58) Field of Search ................................ 438/421, 424; 216/2; 257/776, 419, 524, 622, 510, 506, 244, 324; 174/253

(56) References Cited

U.S. PATENT DOCUMENTS

| | | |
|---|---|---|
| 4,861,420 A | 8/1989 | Knutti et al. |
| 4,882,933 A | 11/1989 | Petersen et al. |
| 4,904,978 A | 2/1990 | Barth et al. |
| 4,993,143 A | 2/1991 | Sidner et al. |
| 5,060,526 A | 10/1991 | Barth et al. |
| 5,062,302 A | 11/1991 | Petersen et al. |
| 5,084,408 A | 1/1992 | Baba et al. |
| 5,198,390 A | 3/1993 | MacDonald et al. |

(List continued on next page.)

OTHER PUBLICATIONS

U.S. application No. 08/874,568, Brosnihan et al., filed Jun. 13, 1997.

U.S. application No. 09/322,381, Clark et al., filed May 28, 1999.

(List continued on next page.)

Primary Examiner—David Nelms
Assistant Examiner—Bau T Le
(74) Attorney, Agent, or Firm—Vierra Magen Marcus Harmon & DeNiro LLP

(57) ABSTRACT

A microstructure and method for forming the microstructure are disclosed. The method includes: providing a handle substrate; providing a device substrate in which high-aspect-ratio structures and optional integrated circuitry will be fabricated; forming one or more filled isolation trenches within a recessed cavity on a first surface of the device substrate or alternatively forming one or more filled isolation trenches on a first surface of the device substrate and forming a recessed cavity on a first surface of the handle substrate; bonding the first surface of the device substrate to the first surface of the handle substrate; removing a substantially uniform amount of material from the second surface of the device substrate to expose at least one isolation trench; optionally forming circuits and interconnection on a second surface of the device substrate; and etching a set of features in the second surface of the device substrate to complete the definition of electrically isolated structural elements.

The micromechanical device includes: a device substrate having a first surface, a second surface, and a semiconductor layer; a handle substrate, the first surface of the device substrate bonded to the handle substrate; one or more first trenches formed in the device substrate, the first trenches extending from the second surface of the device substrate through the device substrate towards the handle substrate; a dielectric within the first trenches; one or more cavities disposed below the second surface of the device layer, a cavity enclosing a portion of at least one trench; at least one second trench formed in the second surface of the device substrate, the second trench completing definition of one or more micromechanical devices.

23 Claims, 10 Drawing Sheets

U.S. PATENT DOCUMENTS

| | | | |
|---|---|---|---|
| 5,231,301 | A | 7/1993 | Peterson et al. |
| 5,313,836 | A | 5/1994 | Fujii et al. |
| 5,326,726 | A | 7/1994 | Tsang et al. |
| 5,343,064 | A | 8/1994 | Spangler et al. |
| 5,355,712 | A | 10/1994 | Petersen et al. |
| 5,445,988 | A | 8/1995 | Schwalke |
| 5,447,067 | A | 9/1995 | Biebl et al. |
| 5,461,922 | A | 10/1995 | Koen |
| 5,476,819 | A * | 12/1995 | Warren .................. 438/421 |
| 5,495,761 | A | 3/1996 | Diem et al. |
| 5,503,285 | A | 4/1996 | Warren |
| 5,504,026 | A | 4/1996 | Kung |
| 5,506,175 | A | 4/1996 | Zhang et al. |
| 5,511,428 | A | 4/1996 | Goldberg et al. |
| 5,537,872 | A | 7/1996 | Frere et al. |
| 5,569,852 | A | 10/1996 | Marek et al. |
| 5,574,222 | A | 11/1996 | Offenberg |
| 5,576,250 | A | 11/1996 | Diem et al. |
| 5,578,755 | A | 11/1996 | Offenberg |
| 5,592,015 | A | 1/1997 | Iida et al. |
| 5,602,052 | A * | 2/1997 | Beasom .................. 438/424 |
| 5,616,523 | A | 4/1997 | Benz et al. |
| 5,627,317 | A | 5/1997 | Offenberg et al. |
| 5,627,318 | A | 5/1997 | Fujii et al. |
| 5,631,422 | A | 5/1997 | Sulzberger et al. |
| 5,706,565 | A | 1/1998 | Sparks et al. |
| 5,719,069 | A | 2/1998 | Sparks |
| 5,719,073 | A | 2/1998 | Shaw et al. |
| 5,723,353 | A | 3/1998 | Muenzel et al. |
| 5,747,353 | A | 5/1998 | Bashir et al. |
| 5,747,867 | A | 5/1998 | Oppermann et al. |
| 5,756,901 | A | 5/1998 | Kurle et al. |
| 5,798,283 | A | 8/1998 | Montague et al. |
| 5,847,280 | A | 12/1998 | Sherman et al. |
| 5,847,454 | A | 12/1998 | Shaw et al. |
| 5,850,042 | A | 12/1998 | Warren |
| 5,882,532 | A * | 3/1999 | Field et al. .................. 216/2 |
| 5,949,144 | A * | 9/1999 | Delgado et al. ............ 257/776 |
| 5,959,208 | A | 9/1999 | Muenzel et al. |
| 6,121,552 | A * | 9/2000 | Brosnihan et al. .......... 174/253 |
| 6,013,933 | A | 11/2000 | Foerstner et al. |
| 6,239,473 | B1 * | 5/2001 | Adams et al. .............. 257/419 |

OTHER PUBLICATIONS

Mohan, J. et al., "An Integrated Accelerometer as a Demonstration of a New Technology Using Silicon Fusion Bonding and Deep Reactive Ion Etching," *Late News Poster Session Supplemental Digest, Solid–State Sensor and Actuator Workshop,* Hilton Head, SC, pp. 21–22, Jun. 3–6, 1996.

Paramaswaran, L. et al., "IC Process Compatibility of Sealed Cavity Sensors," Proc. 1997 International Conference on Solid–State Sensors and Actuators, Chicago, IL, pp. 625–628, Jun. 16–19, 1997.

Sridhar, U et al., "Isolation Process for Surface Micromachined Sensors and Actuators," *iMEMS '97 International MEMS Workshop,* National University of Singapore, Singapore, Dec., 1997.

Sheplak, M. et al., "A wafer–bonded, silicon–nitride membrane microphone with dielectrically–isolated, single–crystal silicon piezoresistors," *Solid–State Sensor and Actuator Workshop,* Hilton Head, SC, pp. 23–26, Jun. 8–11, 1998.

Keller, Christopher, Microfabricated Silicon High Aspect Ratio Flexures for In–Plane Motion, Doctoral Dissertation University of California, 1998.

Brosnihan, Timothy, An SOI Based, Fully Integrated Fabrication Process for High–Aspect–Ratio Microelectromechanical Systems, Doctoral Dissertation, University of California, 1998.

* cited by examiner

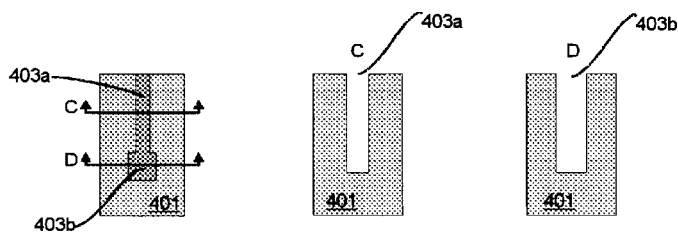
Figure 8 (A) Left, (B) Middle, (C) Right
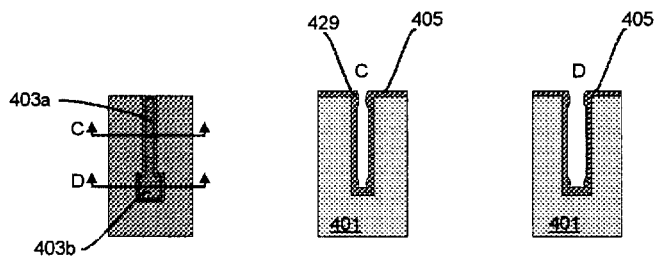
Figure 9 (A) Left, (B) Middle, (C) Right
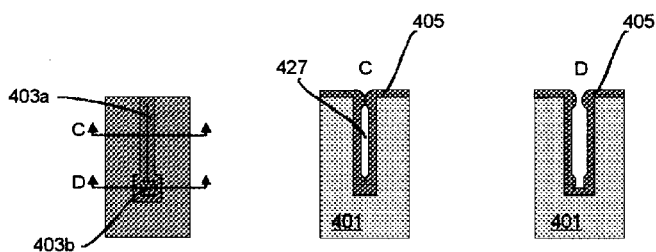
Figure 10 (A) Left, (B) Middle, (C) Right
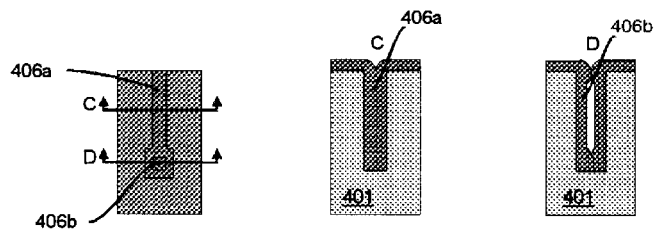
Figure 11 (A) Left, (B) Middle, (C) Right
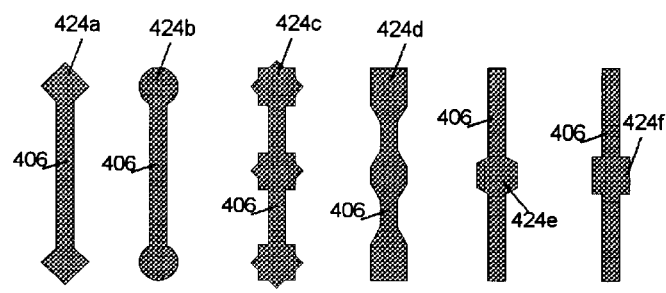
Figure 12 (A) Left through (F) Right

MICROFABRICATED STRUCTURES WITH TRENCH-ISOLATION USING BONDED-SUBSTRATES AND CAVITIES

CROSS-REFERENCE TO RELATED APPLICATION

This application claims priority to Provisional Application Serial No. 60/127,973 filed Apr. 6, 1999 entitled "MICROFABRICATED STRUCTURES WITH TRENCH-ISOLATION USING BONDED-SUBSTRATES AND CAVITIES."

BACKGROUND OF THE INVENTION

1. Field of the Invention

This invention relates generally to microfabricated devices, and more particularly to three-dimensional devices fabricated with high vertical to horizontal aspect ratios. This invention results in high-aspect-ratio devices that may be fabricated with integrated circuitry on the same substrate using conventional microfabrication techniques.

2. Description of the Related Art

MicroElectroMechanical Systems (MEMS) combine mechanical structures and microelectronic circuits to create devices. MEMS have many useful applications such as microsensors and microactuators. Examples of microsensors include inertial instruments such as accelerometers and gyroscopes, detectors for gasses such as carbon-monoxide, and pressure sensors. Examples of microactuators include optical mirrors used for video displays and disk-drive head actuators used for increasing track density. Passive mechanical structures may also be fabricated in a MEMS technology such as a gimbal for a disk-drive head actuator.

Many MEMS-based devices utilize electrical circuits combined with air-gap capacitors to sense motion, or to apply electrostatic forces to a movable structure. Air-gap capacitors are often formed between sets of capacitor plates anchored to a substrate interleaved with plates attached to a movable structure. The performance of many capacitive-based MEMS improves as: 1) the overlap area of capacitor plates increases, 2) the distance between the stationary and movable capacitor plates decreases, 3) the compliance of the structure varies dramatically in different directions, 4) the mass of the structure increases, and 5) the ratio of parasitic capacitance to active sense capacitance decreases. Each of these performance issues is enhanced using high-aspect-ratio semiconductor technologies, wherein thickness or depth of fabricated structures is much larger than small lateral dimensions such as width of flexible beams and gaps between capacitor plates.

Electrical interfaces for capacitive-based MEMS require electrically isolated nodes spanned by one or more variable capacitors such as an air-gap capacitor. Thus, capacitive interfaces using capacitors formed between structural elements require electrical isolation between these structural elements when the structural elements are formed out of a single conductive substrate.

The performance of devices such as accelerometers and gyroscopes may benefit from combining high-aspect-ratio structures with circuits integrated in the same substrate. Hence, a high-aspect-ratio structure etched into a single-crystal silicon substrate that also contains integrated circuits is of particular interest. Of even greater interest is a process sequence that yields structures and circuits in the same substrate but does not significantly alter complex and expensive circuit fabrication processes. Such a process sequence enables cost-effective manufacture of devices comprising integrated circuits and structures on a single substrate.

For improved performance, an integrated MEMS process should address three issues. First, the structural elements should be formed by a high-aspect-ratio process. Second, fabrication of mechanical structures should have a minimal impact on fabrication of associated circuitry on the same substrate. Third, structural elements should be electrically isolated from one another, the substrate, and circuit elements except where interconnection is desired.

SUMMARY OF THE INVENTION

The invention, roughly described, comprises a microelectromechanical structure and method of forming the structure. In one aspect, the method includes: providing a handle substrate; providing a device substrate in which high-aspect-ratio structures and optional integrated circuitry will be fabricated; forming one or more filled isolation trenches within a recessed cavity on a first surface of the device substrate or alternatively forming one or more filled isolation trenches on a first surface of the device substrate and forming a recessed cavity on a first surface of the handle substrate; bonding the first surface of the device substrate to the handle substrate; removing a substantially uniform amount of material from the second surface of the device substrate to expose at least one isolation trench; optionally forming circuits and interconnection on a second surface of the device substrate; and etching a set of features in the second surface of the device substrate to complete the definition of electrically isolated structural elements. The structural-definition etch may also provide electrical isolation among various structural elements, and provide electrical isolation between structural elements and the device substrate except at mechanical attachment points between structural elements or structural elements and the device substrate. The isolation trenches and an insulating material deposited in the isolation trenches may provide electrical isolation at these mechanical attachment points. Structural elements may include, but are not limited to one or more of the following: beams, flexures, springs, levers, proof-masses, fixed air-gap capacitors, and variable air-gap capacitors.

In a further aspect of the invention, a device includes: a device substrate having a first surface, a second surface, and a semiconductor layer; a handle substrate, the first surface of the device substrate bonded to the handle substrate; one or more first trenches formed in the device substrate, the first trenches extending from the second surface of the device substrate through the device substrate towards the handle substrate; a dielectric within the first trenches; one or more cavities disposed below the second surface of the device layer, a cavity enclosing a portion of at least one trench; at least one second trench formed in the second surface of the device substrate, the second trench completing definition of one or more micromechanical devices. The second trench may provide electrical isolation among various structural elements, and provide electrical isolation between structural elements and the device substrate except at mechanical attachment points between structural elements or structural elements and the device substrate. The first trenches provide electrical isolation at these mechanical attachment points. Micromechanical elements may include, but are not limited to one or more of the following: beams, flexures, springs, levers, proof-masses, fixed air-gap capacitors, and variable air-gap capacitors.

The invention allows conducting material to be deposited over exposed isolating trenches to provide electrical connectivity to the structural elements. Conducting material deposited over exposed isolating trenches may also be used to interconnect among electrically isolated circuit and structural elements. Circuit elements may be formed in the device substrate including active devices such as transistors. A single insulating material deposited or grown in the trenches may entirely fill the trenches or an additional filler material may be added to complete filling of trenches after an initial deposition of a first insulating material. The handle or device substrate may include single-crystal or epitaxial silicon, the isolation material may include silicon dioxide or silicon nitride, and the trench fill material may include polycrystalline silicon.

Advantages of the invention include improving the performance of microstructures fabricated in accordance with the invention due to the high-aspect-ratio fabrication that yields larger mass, air-gap capacitors with larger sensitivity, and improved suppression of undesired deflections particularly deflections out of the plane of the device substrate. Fabrication of devices in accordance with the invention may provide mechanical structures mechanically free from the handle substrate without a wet release step. Fabrication of devices in accordance with the invention may also provide a means for alignment of photolithographic masks to a nominally hidden recessed cavity, enabling accurate placement of mechanical structures and optional interconnect or circuits with respect to the recessed cavity with standard photolithographic tools. Fabrication of devices in accordance with the invention may provide substantially voidless isolation trench fill while maintaining good electrical isolation across isolation trenches. Fabrication of devices in accordance with the invention may furthermore provide lower parasitic capacitances in proportion to active sense capacitance than prior art inventions since the invention allows for the use of lower dielectric constant isolation materials than prior art solutions. When circuits are co-fabricated on the device substrate with the mechanical device, performance of devices fabricated in accordance with the invention may be improved due to the proximity of interface circuitry built into the same substrate as the microstructure. Furthermore, when circuits are co-fabricated on the device substrate with the mechanical device, the handle substrate is comprised of heavily doped silicon, the device substrate is comprised of silicon, and the two substrates are bonded by either fusion or thermal compression bonding, a low resistance contact to the back-side of the circuits may be attained.

BRIEF DESCRIPTION OF THE DRAWINGS

The invention will be described with respect to the particular embodiments thereof. Other objects, features, and advantages of the invention will become apparent with reference to the specification and drawings in which:

FIGS. 1A–1I show plan- and cross-sectional views of a handle substrate and device substrate, respectively, illustrating a first embodiment of the present invention wherein:

FIG. 1A is a plan- and cross-sectional view of a handle-substrate and device substrate.

FIG. 1B is a plan- and cross-sectional view of a handle-substrate and device substrate after formation of a cavity.

FIG. 1C is a plan- and cross-sectional view of a handle-substrate and device substrate after formation of a trench and optional doping.

FIG. 1D is a plan- and cross-sectional view of a handle-substrate and device substrate after deposition or growth of an insulating dielectric material.

FIG. 1E is a plan- and cross-sectional view of a handle-substrate and device substrate after blanket etchback of the dielectric material from the device substrate.

FIG. 1F is a plan- and cross-sectional view of a handle-substrate and device substrate after bonding to form a bonded wafer pair FIG. 1G is a plan- and cross-sectional view of a bonded wafer pair after removal of a portion of the device substrate showing an exposed isolation trench.

FIG. 1H is a plan- and cross-sectional view of a bonded wafer pair after optional processing that results in the formation of electrical interconnect.

FIG. 1I is a plan- and cross-sectional view of a bonded wafer pair after structural definition.

FIGS. 2A–2K are plan- and cross-sectional views of a handle substrate and device substrate illustrating a second embodiment of the invention wherein:

FIG. 2A is a plan- and cross-sectional view of a handle-substrate and device substrate.

FIG. 2B is a plan- and cross-sectional view of a handle-substrate and device substrate after formation of a trench.

FIG. 2C is a plan- and cross-sectional view of a handle-substrate and device substrate after deposition or growth of an insulating dielectric material.

FIG. 2D is a plan- and cross-sectional view of a handle-substrate and device substrate after patterning of the dielectric material into a hard-mask.

FIG. 2E is a plan- and cross-sectional view of a handle-substrate and device substrate after formation of a cavity.

FIG. 2F is a plan- and cross-sectional view of a handle-substrate and device substrate after blanket etchback of the remaining dielectric material from the device substrate.

FIG. 2G is a plan- and cross-sectional view of a handle-substrate and device substrate after an optional doping step.

FIG. 2H is a plan- and cross-sectional view of a handle-substrate and device substrate after bonding to form a bonded wafer pair FIG. 2I is a plan- and cross-sectional view of a bonded wafer pair after removal of a portion of the device substrate showing an exposed isolation trench.

FIG. 2J is a plan- and cross-sectional view of a bonded wafer pair after optional processing that results in the formation of electrical interconnect.

FIG. 2K is a plan- and cross-sectional view of a bonded wafer pair after structural definition.

FIGS. 3A–3I are plan- and cross-sectional views of a handle substrate and device substrate illustrating a third embodiment of the invention wherein:

FIG. 3A is a plan- and cross-sectional view of a handle-substrate and device substrate.

FIG. 3B is a plan- and cross-sectional view of a handle-substrate and device substrate after formation of a trench.

FIG. 3C is a plan- and cross-sectional view of a handle-substrate and device substrate after an optional doping step.

FIG. 3D is a plan- and cross-sectional view of a handle-substrate and device substrate after deposition or growth of an insulating dielectric material.

FIG. 3E is a plan- and cross-sectional view of a handle-substrate and device substrate after blanket etchback of the dielectric material from the device substrate, and formation of a cavity in the handle substrate.

FIG. 3F is a plan- and cross-sectional view of a handle-substrate and device substrate after bonding to form a bonded wafer pair FIG. 3G is a plan- and cross-sectional view of a bonded wafer pair after removal of a portion of the device substrate showing an exposed isolation trench.

FIG. 3H is a plan- and cross-sectional view of a bonded wafer pair after optional processing that results in the formation of electrical interconnect.

FIG. 3I is a plan- and cross-sectional view of a bonded wafer pair after structural definition.

FIG. 8A is a plan-view and FIGS. 8B,C are cross-sectional views of a trench with a condyle.

FIG. 9A is a plan-view and FIGS. 9B,C are cross-sectional views of a trench with a condyle during deposition of insulating material and before pinching-off of the trench occurs.

FIG. 10A is a plan-view and FIGS. 10B,C are cross-sectional views of a trench with a condyle during deposition of insulating material after pinching-off of the trench, but before pinching-off of the condyle occurs.

FIG. 11A is a plan-view and FIGS. 11B,C are cross-sectional views of a trench with a condyle after deposition of insulating material and after pinching-off of both the trench and the condyle.

FIGS. 12A–F are a series of plan views of filled trenches with different-shaped filled condyles.

DETAILED DESCRIPTION

In general, fabrication of a micromechanical device in accordance with the invention comprises six basic steps: providing a device substrate with first and second surfaces; providing a handle substrate with first and second surfaces; forming one or more filled isolation trenches portions of which lie within a recessed cavity on the first surface of the device substrate or alternatively forming one or more filled isolation trenches on the first surface of the device substrate and forming a recessed cavity on the first surface of the handle substrate; bonding the first surface of the device substrate to the first surface of the handle substrate; removing a portion of the second surface of the device substrate to expose at least one isolation trench; and etching a set of features in the second surface of the device substrate to complete the definition of electrically isolated structural elements.

FIGS. 1A through FIG. 1I illustrate a first embodiment of the present invention. Both plan- and cross-sectional views of a portion of the device and handle substrates are shown to illustrate the steps in fabrication of devices in accordance with the present invention. Although only one mechanical device is shown for clarity throughout the following description, it will be understood that many mechanical structures are typically formed simultaneously on a single set of device and handle substrates.

Figure 1A:
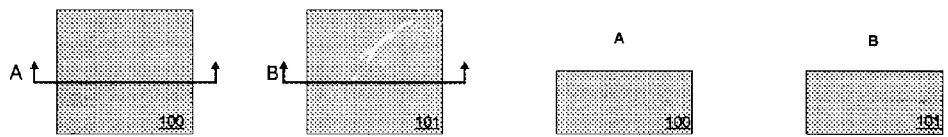

FIG. 1A shows a handle substrate 100 and device substrate 101, in plan view, and cross-sections A—A and B—B. For convenience, FIGS. 1B–1I use common nomenclature and reference numbers. While different materials may be used, the handle substrate 100 may be a substantially homogenous material including, but not limited to: doped or undoped single-crystal silicon, quartz, glass, or aluminum oxide. Alternatively the handle substrate may be a structure having a number of layers including: a thin layer of silicon dioxide on a first surface of silicon, and a thin layer of silicon nitride on a first surface of silicon. The device substrate 101 may be single-crystal silicon, undoped silicon, p-type silicon, n-type silicon, silicon with a thin (5 to 50 microns) layer of heavily p-doped silicon on the first surface, and silicon with a thin layer (5 to 50 microns) of heavily ndoped silicon on the first surface. Both the handle and device substrates may be substantially cylindrical wafers having a thickness of approximately 250 microns to 2 millimeters and a diameter from approximately 100 mm to 300 mm.

Figure 1B:
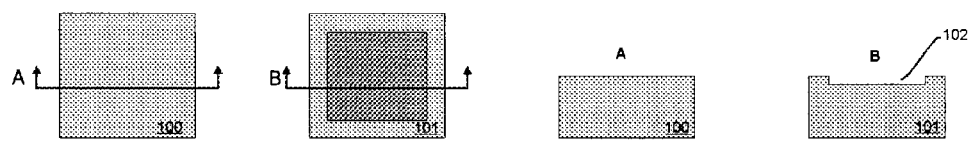

In FIG. 1B, a photolithographic mask (not shown) is used to form a first pattern in photosensitive material on a first face of the device substrate. Alternatively, in conjunction with an appropriate deposited or grown masking material such as silicon dioxide, the photosensitive material may be used to form a hard-mask pattern on the first surface of the device layer. A first etch, denoted the cavity etch, forms one or more cavities 102 in the first surface of the device substrate including at least one cavity that may be used for alignment of subsequent photolithography steps, the cavities being formed in regions where the device substrate is exposed through the first pattern. The cavity 102 is typically 0.5 to 25 microns deep and may be etched using a plasma-etch, a wet anisotropic etch including potassium hydroxide (KOH), tetramethyl ammonium hydroxide (TMAH), ethylenediamine-pyrocatechol water (EDP), or an isotropic etch including a silicon etchant solution made from nitric acid, water, and ammonium fluoride.

Next, the first masking material is removed, a photosensitive material is deposited on the first surface of the device substrate, a second photolithographic mask (not shown) is aligned to a feature formed during the cavity etch, and the photosensitive material patterned. Again, alternatively the photosensitive material may be used to form a hard-mask pattern.

Figure 1C:
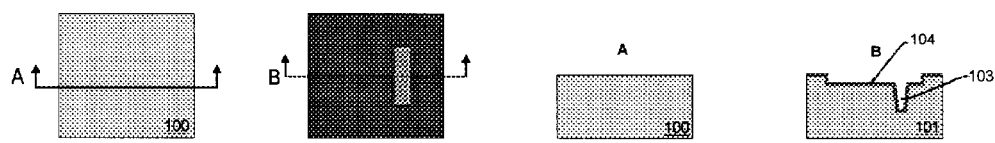

As shown in FIG. 1C, a second etch, alternatively referred to herein as the trench etch, forms one or more trenches 103 within a cavity 102. At least one such trench may be used for alignment of subsequent photolithography steps. The trenches are formed in regions where the device substrate is exposed through the second pattern. Trenches 103 are typically 5 to 250 microns deep, 1 to 10 microns wide, and may be etched using a plasma-etch which may be a deep reactive-ion-etch, for example. The trenches 103 may have a tapered profile as shown in FIG. 1C, or alternatively the trench may have substantially parallel sides. The trenches may have a tapered profile narrowing with depth, with sidewall angles less than approximately 20 degrees from the substantially parallel case. Next, the second masking material is removed.

At this point an optional doping step may be performed resulting in a layer of doped material 104. If the doping step is performed the dopant may include boron, phosphorous, antimony, arsenic or other species, and may be performed using solid-source diffusion, ion implantation, or liquid-dopants either spun-on or vapor-deposited. Solid-source and liquid-dopants allow the active species to be deposited along the sides of trenches 103, potentially lowering structural interconnect resistance. The optional doping step may include a high-temperature drive-in step in which the dopant is diffused into the substrate.

Figure 1D:
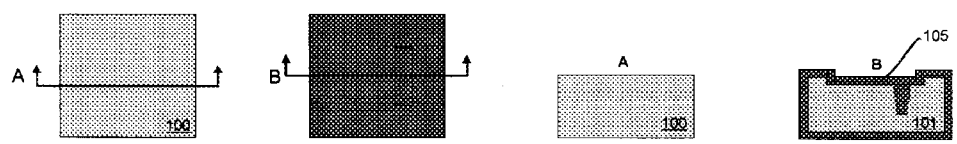
Figure 1E:
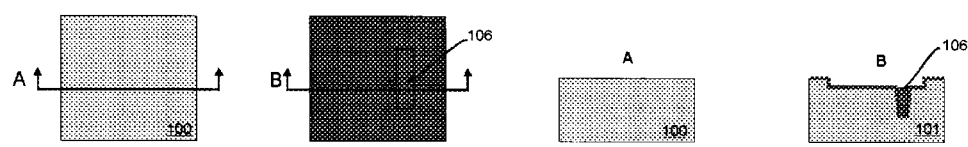

At this point an insulating dielectric 105 is deposited or grown on the device substrate as illustrated in FIG. 1D. The insulating dielectric may include, for example, deposited silicon dioxide, grown thermal oxide, deposited TEOS oxide, low-pressure chemical vapor deposited (LPCVD) silicon nitride, deposited phosphosilicate glass, deposited arsenic glass, deposited boron glass, or deposited borophosphosilicate glass. The insulating dielectric may substantially fill the trenches 103, or a separate material, such as polysilicon, may be subsequently deposited to substantially fill the trenches. Next, the material deposited or grown during the previous step may be blanket-etched from the first surface of the covered device substrate, with the etch continuing until the first surface of the device substrate is exposed except at regions where trenches 103 exist, shown in FIG. 1 E. This etch, alternatively referred to herein as a dielectric-removal etch, may be a plasma-etch or wet etch, with a composition appropriate for the chosen dielectric material 105. Since this etch is a blanket-etch and ends when the substrate is exposed, dielectric material will remain in trenches 103 forming substantially filled isolation trenches 106. Alternatively, when the dielectric material is desired for substrate bonding, a separate masking step in which a photolithographic mask is aligned to one or more features formed during either the cavity or trench etches may be used to protect selected areas of the deposited dielectric from removal at regions other than the trenches 103.

Figure 1F:
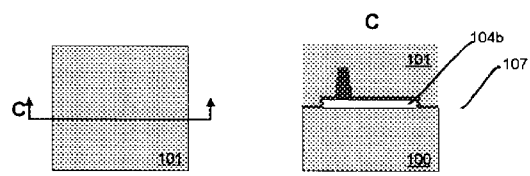

Following this step, the first surface of the device substrate, or dielectric (if not removed from selected regions of the first surface of the device substrate), is bonded to the first surface of the handle substrate forming a bonded substrate pair 107, as shown in FIG. 1F. Bonding may be attained by any of a number of well-known techniques including fusion bonding, thermal compression bonding, or anodic bonding. Prior to bonding, the bonding surfaces of the device- and handle-substrates may be planarized to decrease defects in the device- to handle-substrate bond. Planarization may be achieved using, among other methods, chemical-mechanical polishing (CMP). The bonding process may be carried out in a controlled atmosphere so that closed cavities 104B are filled by a defined gas at a defined pressure. For example, the bonding process may be carried out in a partial vacuum, or in an atmosphere including nitrogen, argon, helium, oxygen, or hydrogen.

Figure 1G:
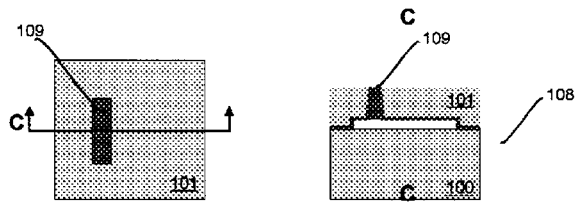

After bonding, device substrate material is removed until the bottom 109 of at least one filled isolation trench 106 is exposed from a second surface of the device substrate that also forms a first surface 101a of the bonded substrate pair 108 as shown in FIG. 1G. Note that removal of the substrate material may also expose filled isolation trenches that may be used for alignment of subsequent photolithography steps. Removal of material during this step may be achieved using many techniques known to those skilled in the art including: grinding, CMP, plasma-etching, and electrochemical etching. Note that if a particularly large micromechanical structure is to be formed, and thus a large cavity is required, studs may be created to help support the device layer in the presence of a differential pressure across the device layer. A differential pressure may arise, for example, when the bonded substrate pair is placed in a low-pressure, high temperature chemical vapor deposition furnace and the cavity is filled with nitrogen. A stud may be formed by defining an annular or similar shaped cavity wherein the center of the annulus is incorporated into the bonding interface between the device and handle substrates. Large structures may be freed from studs by removing material surrounding the stud during the structural definition etch, described below.

At this point, optional processing that provides for electrical interconnect or circuitry, including transistors, may be carried out. Alignment of photolithographic masks used to define the interconnect or circuitry to the second surface of the device substrate may be achieved using the exposed trench bottoms 109.

Figure 1H:
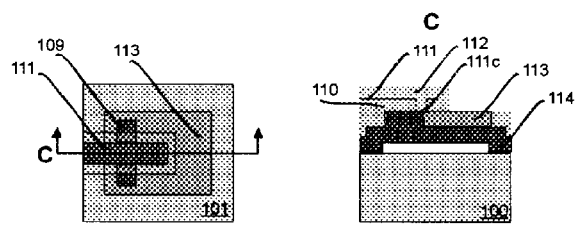
Figure 1I:
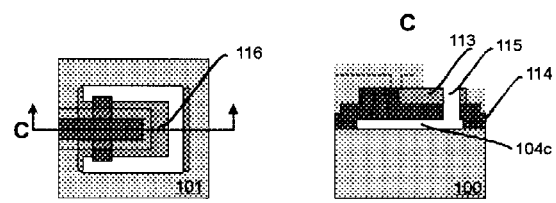

Referring to FIG. 1H, if the optional processing provides for only electrical interconnection between structural elements formed subsequently, the optional processing may include the steps of: depositing or growing a first dielectric material 110; patterning the first dielectric material using photolithographic masks aligned to an alignment mark formed by one or more exposed trench bottoms 109; depositing a first layer of conducting material 111; patterning the first layer of conducting material; depositing a second dielectric layer 112; and patterning the second dielectric layer. The pattern formed in the first dielectric material may include one or more regions where electrical contacts 111C to subsequently defined structural elements 116 are formed by the first layer of deposited conducting material. If the optional processing provides for both electrical interconnection and circuitry formed on the second surface of the device substrate, the optional processing may include: alignment of a first photolithographic mask to an alignment mark formed by one or more exposed trench bottoms 109; implantation and diffusion of a doping material 113; depositing or growing a first dielectric material 110; patterning the first dielectric material 110; depositing a first layer of metal 111; patterning the first layer of metal; depositing a second dielectric layer 112; and patterning the second dielectric layer 112.

Circuit formation may be accomplished using any number of well-known semiconductor circuit fabrication processes, including CMOS or BiCMOS, that will result in electronic circuit elements, such as transistors, and electrical interconnection among circuit elements. Circuit elements may be formed in regions remote from subsequently defined mechanical structures 116. Circuit elements may also be formed in regions that are later defined into isolated mechanical structures 116. Some of these structures may be movable with respect to the remainder of the device substrate. Note that the formation of mechanical structures mechanically free from the handle substrate without a wet release step renders etch holes unnecessary, enabling significant circuit complexity to be brought onto a mechanical structure. In addition, circuit formation may result in one or more conductors 111 that connect to the substrate material by contacts 111C, shown in FIG. 1H. The conductors and contacts may permit electrical connection among subsequently defined structures 116 and electrical circuits. Electrical circuits may be used for measurement of capacitance (often called sense-capacitance) between isolated mechanical structures to yield a quantity representative of distance between the mechanical structures, for example. Electrical circuits may also be used to apply voltages to electrically isolated mechanical structures to generate electrostatic forces. Other uses of electrical circuits include, but are not limited to: calculating or signal processing of quantities based on measurements of sense-capacitance; sustaining oscillation of a mechanical structure; measurement of changes in a piezoresistor which may be formed in the device substrate; and measurement of current flow due to electron-tunneling between isolated mechanical structures.

Figure 4:
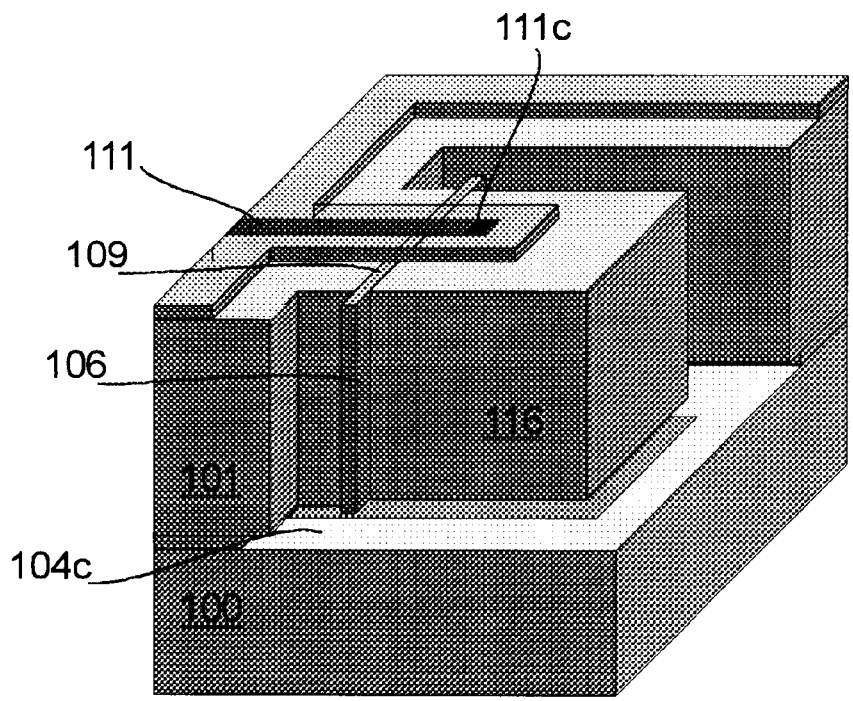
FIG. 4 is a perspective view of an electrically isolated structure with interconnection formed in accordance with the invention.

One or more mechanical structures 116 are defined with a third etch, alternatively referred to herein as a structure-definition etch. Referring to FIG. 11, an anisotropic etch, which may, for example, be a deep reactive-ion-etch, removes portions of device substrate 101 to expose and open at least one closed cavity 104B. Removal of excess material of substrate 101 leaves open regions 115 that define at least one mechanical structure 116. Structural elements may include but are not limited to, one or more beams, flexures, springs, levers, proof-masses, fixed air-gap capacitors, and variable air-gap capacitors. The removal of excess material of substrate 101 not only defines mechanical structures but also provides a majority of required electrical isolation between isolated mechanical structures. Additional isolation is provided by isolation trenches 106. A perspective view of a simple cantilever beam with electrical isolation and interconnection formed in accordance with the present invention is shown in FIG. 4.

In alternative versions of the method according to the invention, the specific order in which certain steps occur may be interchanged, or the substrate in which the cavity is formed may be varied. For example, a first variation is shown in FIG. 2A through FIG. 2K in accordance with a second embodiment of the method according to the invention. In this embodiment, the method according to the invention is comprised of the same six basic steps as the first embodiment, with a variation in the means by which the filled isolation trenches within a recessed cavity on the first surface of the device substrate are formed.

Figure 2A:
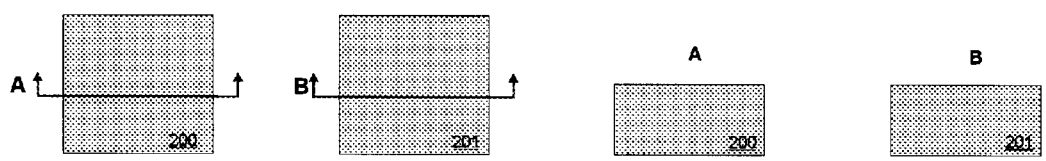
Figure 2B:
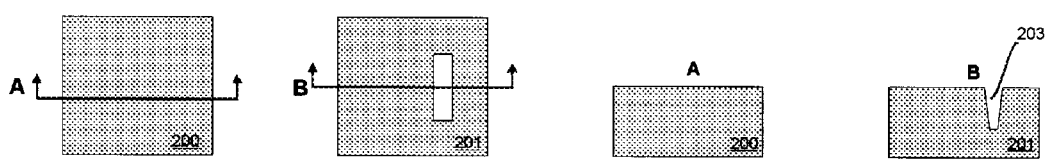
Figure 2C:
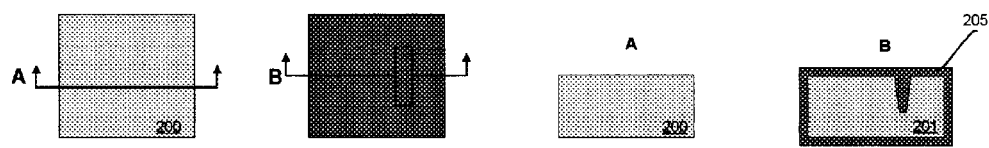
Figure 2D:
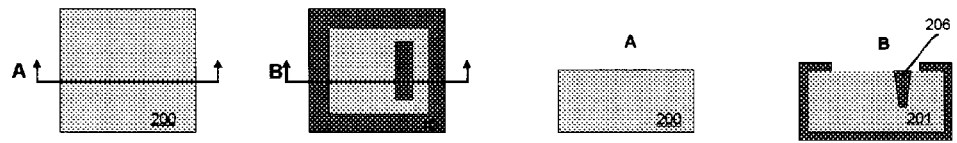

In FIG. 2B, a photolithographic mask (not shown) is used to form a first pattern in photosensitive material on a first face of the device substrate 201. Alternatively, the photosensitive material may be used to form a hard-mask pattern on the first surface of the device layer. A trench etch forms one or more trenches 203 in the first surface of the device substrate including at least one trench that may be used for alignment of subsequent photolithography steps, the trenches being formed in regions where the device substrate is exposed through the first pattern. Trenches 203 are typically 5 to 250 microns deep, 1 to 10 microns wide, and may be etched using a plasma-etch which may be a deep reactive-ion-etch, for example. The trenches 203 may have a tapered profile as shown in FIG. 2B, or alternatively the trench may have substantially parallel sides. The trenches may have a tapered profile narrowing with depth, the profile having sidewall angles less than approximately 20 degrees from the substantially parallel case. At this point an insulating dielectric 205 is deposited or grown on the device substrate as illustrated in FIG. 2C. The insulating dielectric may include deposited silicon dioxide, grown wet thermal oxide, grown dry thermal oxide, deposited TEOS oxide, LPCVD silicon nitride, deposited phosphosilicate glass, deposited arsenic glass, deposited boron glass, or deposited borophosphosilicate glass. The insulating dielectric may substantially fill the trenches 203, or a separate material, such as polysilicon, may be subsequently deposited to substantially fill the trenches.

Next, dielectric 205 deposited or grown during the previous step may be photolithographically patterned, with a mask aligned to one or more filled isolation trenches, and etched from the first surface of the covered device substrate. The etch continues until the first surface of the device substrate is exposed in areas defined by openings in the mask, FIG. 2D. This etch, alternatively referred to herein as the dielectricremoval etch, may be a plasma-etch or wet etch, with a composition appropriate for the chosen dielectric material 205. Patterning the dielectric material 205 in this fashion results in a hard-mask that may be used in the subsequent cavity-etch step. Alternatively, the material deposited or grown during the previous step may be blanket-etched from the first surface of the covered device substrate, with the etch continuing until the first surface of the device substrate is exposed except at regions where trenches 203 exist. In this case a separate photolithography step with a photosensitive material, aligned to one or more filled isolation trenches, is performed to define areas in which subsequent cavities are to be etched. Note that in both cases the blanket-etch ends when the substrate is exposed; thus, dielectric material will remain in trenches 203 forming substantially filled isolation trenches 206.

Figure 2E:
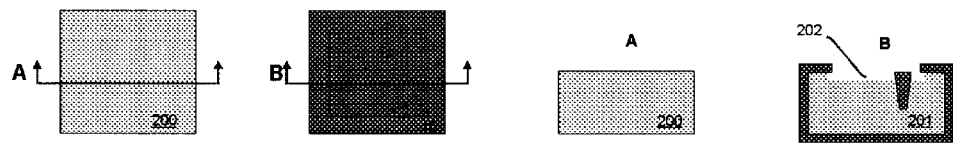
Figure 2F:
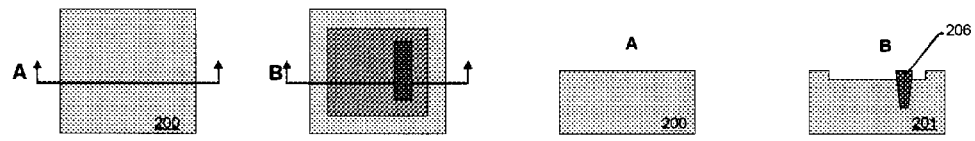

Referring to FIG. 2E, a cavity etch subsequently forms one or more cavities 202 in the first surface of the device substrate, the cavities being formed in regions where the device substrate is exposed through the hard-mask pattern or the pattern formed by the photosensitive material. The cavity 202 is typically 0.5 to 25 microns deep and may be etched using a plasma-etch, a wet anisotropic etch including potassium hydroxide, TMAH, or EDP, or an isotropic etch including a silicon etchant solution made from nitric acid, water, and ammonium fluoride. At this point, if the masking material is a photosensitive material it is removed. If a hard-mask is used the hard-mask may be removed or retained to aid in the bonding process. In FIG. 2F, the hard-mask is removed.

Figure 2G:
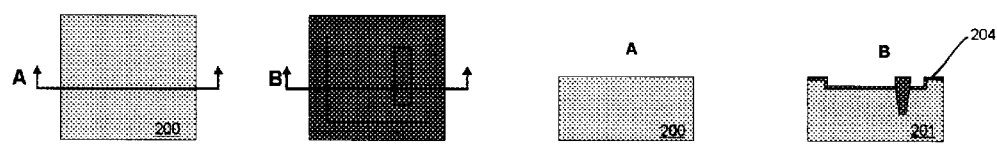

An optional doping step may now be performed resulting in a layer of doped material 204, shown in FIG. 2G. If the doping step is performed the dopant may include boron, phosphorous, antimony, arsenic or other species and may be deposited using solid-source diffusion, ion implantation, or liquid-dopants either spun-on or vapor-deposited. The optional doping step may include a high-temperature drive-in step in which the dopant is diffused into the substrate.

Figure 2H:
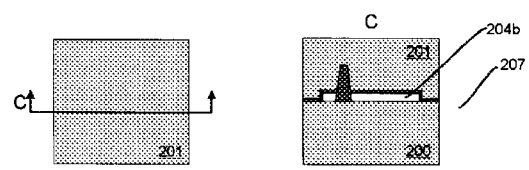
Figure 2I:
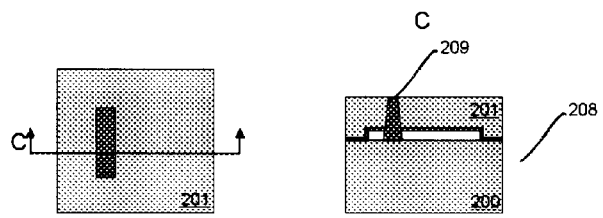
Figure 2J:
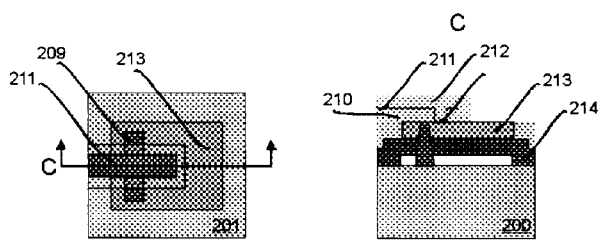
Figure 2K:
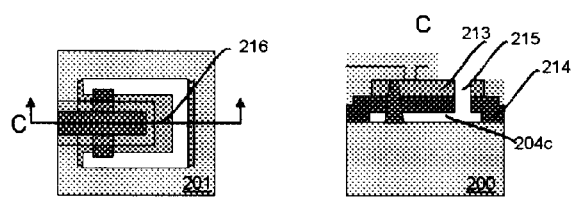

Following this step, the first surface of the device substrate, or dielectric if not removed from the first surface of the device substrate, may be bonded to the first surface of the handle substrate 200 forming a bonded substrate pair 207, as shown in FIG. 2H. Bonding may be attained by any of a number of well-known techniques including fusion bonding, thermal compression bonding, or anodic bonding. Prior to bonding, the bonding surfaces of the device- and handle-substrates may be planarized to decrease defects in the device- to handle-substrate bond. Planarization may be achieved using, among other methods, chemical-mechanical polishing. The bonding process may be carried out in a controlled atmosphere so that closed cavities 204B are filled by a defined gas at a defined pressure. For example, the bonding process may be carried out in a partial vacuum, or in an atmosphere including nitrogen, argon, or helium, oxygen, or hydrogen. After bonding, material is removed until the bottom 209 of at least one filled isolation trench 206 is exposed from a second surface of the device substrate that also forms a first surface of the bonded substrate pair 208 as shown in FIG. 2I. Note that removal of the substrate material may also expose filled isolation trenches that may be used for alignment of subsequent photolithography steps. Removal of material during this step may be achieved using many techniques known to those skilled in the art including: grinding, chemical-mechanical polishing, plasma-etching, and electrochemical etching. At this point, optional processing that provides for electrical interconnect or circuitry, including transistors, may be carried out, as described in the first embodiment and shown in FIG. 2J. Structures are subsequently defined as described in the first embodiment and shown in FIG. 2K.

A second variation of the method according to the invention is shown in FIG. 3A through FIG. 3I in a third embodiment. In this embodiment the method according to the invention is comprised of the same six basic steps as the first embodiment, with a variation in which substrate the cavities are formed; specifically, cavities are formed in the first surface of the handle substrate.

Figure 3A:
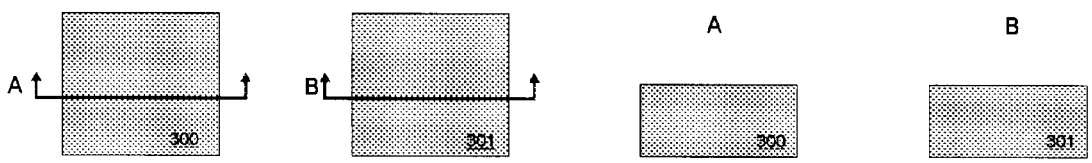
Figure 3B:
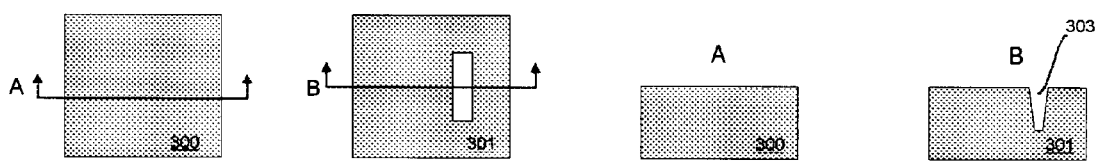

In FIG. 3B, a photolithographic mask (not shown) is used to form a first pattern in photosensitive material on a first face of the device substrate. Alternatively, the photosensitive material may be used to form a hard-mask pattern on the first surface of the device layer. A trench etch forms one or more trenches 303 in the first surface of the device substrate 301 including at least one trench that may be used for alignment of subsequent photolithography steps, the trenches being formed in regions where the device substrate is exposed through the first pattern. Trenches 303 are typically 5 to 250 microns deep, 1 to 10 microns wide, and may be etched using a plasma-etch which may be a deep reactive-ion-etch, for example. The trenches 303 may have a tapered profile as shown in FIG. 3b, or alternatively the trench may have substantially parallel sides. The trenches may have a tapered profile narrowing with depth, the profile having sidewall angles less than approximately 20 degrees from the substantially parallel case.

Figure 3C:
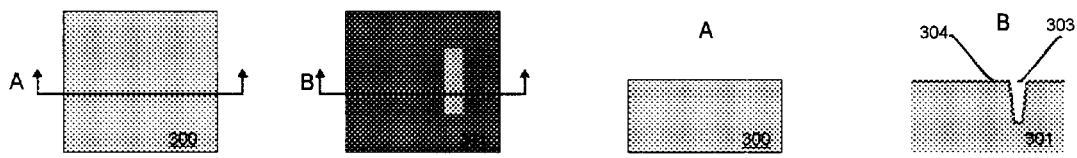

An optional doping step may now be performed resulting in a layer of doped material 304, shown in FIG. 3C. If the doping step is performed the dopant may include boron, phosphorous, antimony, arsenic or other species and may be deposited using solid-source diffusion, ion implantation, or liquid-dopants either spun-on or vapor-deposited. The optional doping step may include a high-temperature drive-in step in which the dopant is diffused into the substrate.

Figure 3D:
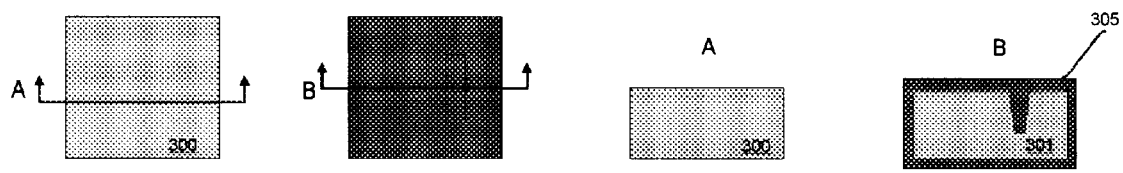

At this point an insulating dielectric 305 is deposited or grown on the device substrate as illustrated in FIG. 3D. The insulating dielectric 305 may include deposited silicon dioxide, grown wet thermal oxide, grown dry thermal oxide, deposited TEOS oxide, LPCVD silicon nitride, deposited phosphosilicate glass, deposited arsenic glass, deposited boron glass, or deposited boro-phosphosilicate glass. The insulating dielectric may substantially fill the trenches 303, or a separate material, such as polysilicon, may be subsequently deposited to substantially fill the trenches.

Figure 3E:
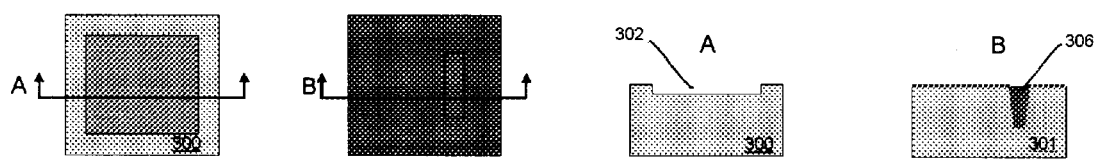

Referring to FIG. 3E, the insulating dielectric 305 deposited or grown during the previous step may be blanket-etched from the first surface of the covered device substrate, with the etch continuing until the first surface of the device substrate is exposed except at regions where trenches 303 exist. This etch, alternatively referred to as the dielectric-removal etch, may be a plasma-etch or wet etch, with a composition appropriate for the chosen dielectric material 305. Since the blanket-etch ends when the substrate is exposed, dielectric material will remain in trenches 303 forming substantially filled isolation trenches 306. Alternatively, when the dielectric material 305 is desired for substrate bonding, a separate masking step in which a photolithographic mask is aligned to one or more features formed during the trench etch may be used to protect selected areas of the deposited dielectric from removal at regions other than the trenches 303.

Again referring to FIG. 3E, a cavity etch forms one or more cavities 302 in the first surface of the handle substrate, the cavities being formed in regions where the handle substrate is exposed through a hard-mask, formed by a photolithography and etch step to form a hard-mask pattern, or a pattern formed by a photolithography step. The cavity 302 is typically 0.5 to 25 microns deep and may be etched using a plasma-etch, a wet anisotropic etch including potassium hydroxide, TMAH, or EDP, or an isotropic etch including a silicon etchant solution made from nitric acid, water, and ammonium fluoride. At this point, if the masking material is a photosensitive material it is removed. If a hard-mask is used the hard-mask may be removed or retained to aid in the bonding process.

Figure 3F:
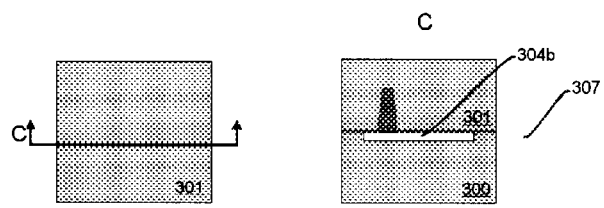
Figure 3G:
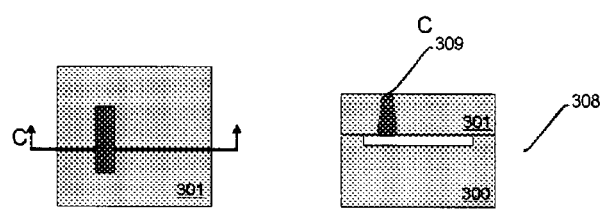
Figure 3H:
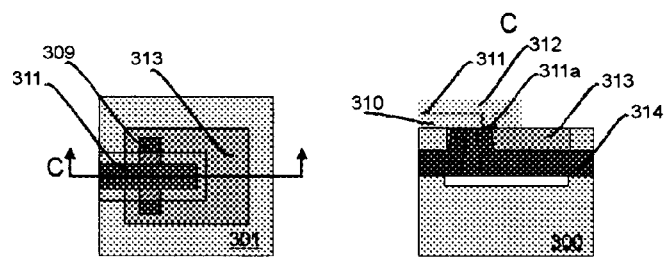
Figure 3I:
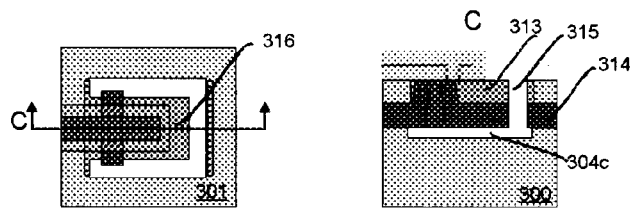

Following this step, the first surface of the device substrate 301, or dielectric if not removed from the first surface of the device substrate, may be aligned and bonded to the first surface of the handle substrate 300 forming a bonded substrate pair 307, as shown in FIG. 3F. Alignment of the filled trenches 306 to the cavities 302 may be provided by an optical alignment system that uses infrared light to make the relative positions of filled trenches 306 and cavities 302 known. Alternatively, an aligner that uses visible light for wafer to wafer alignment may be used, such as the Karl Suss Bond Aligner (MA/BA6). Bonding may be attained by any of a number of well known techniques including fusion bonding, thermal compression bonding, or anodic bonding. Prior to bonding, the bonding surfaces of the device- and handle-substrates may be planarized to decrease defects in the device- to handle-substrate bond. Planarization may be achieved using, among other methods, chemical-mechanical polishing. The bonding process may be carried out in a controlled atmosphere so that closed cavities 304B are filled by a defined gas at a defined pressure. For example, the bonding process may be carried out in a partial vacuum, or in an atmosphere including nitrogen, argon, or helium, oxygen, or hydrogen. After bonding, material is removed until the bottom 309 of at least one filled isolation trench 306 is exposed from a second surface of the device substrate that also forms a first surface of the bonded substrate pair 308 as shown in FIG. 3G. Note that removal of the substrate material may also expose filled isolation trenches that may be used for alignment of subsequent photolithography steps. Removal of material during this step may be achieved using many techniques known to those skilled in the art including: grinding, chemical-mechanical polishing, plasma-etching, and electrochemical etching. At this point, optional processing that provides for electrical interconnect or circuitry, including transistors, may be carried out, as described in the first embodiment and shown in FIG. 3H. Structures are subsequently defined as described in the first embodiment and shown in FIG. 3I.

Figure 5:
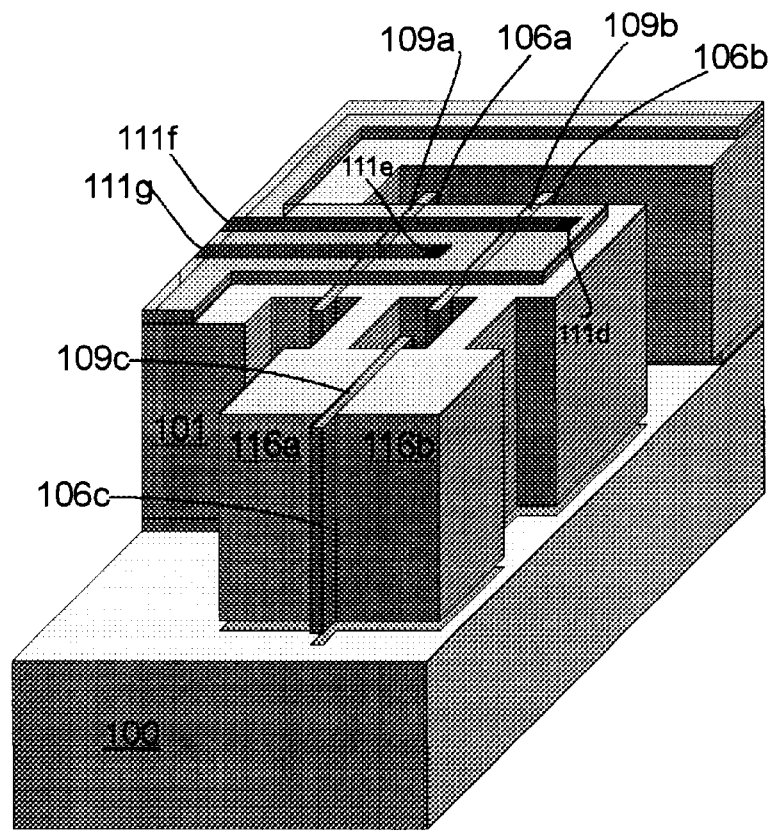
FIG. 5 is a perspective view of a single structural element comprised of two rigidly coupled masses with two distinct electrical nodes formed in accordance with the invention.

The method described above also provides for fabrication of structural elements that comprise multiple electrical nodes. FIG. 5 shows an example of a single structural element that contains two masses 116a,b rigidly joined by a trench 106c, the structural element having two distinct electrical nodes. In a unique feature of the present invention, structural nodes may be electrically isolated from one another by such refilled trenches 106c. The structure is electrically isolated from and mechanically anchored to the device substrate by refilled trench 106a. Electrical interconnection to the different masses is made using conductive interconnect 111f,g in conjunction with electrical contacts 111d,e. Note refilled trench 106c is not mechanically attached to the underlying handle substrate due to the nature of the process sequence, thereby enabling movement of released mechanical structures with respect to the substrate.

Figure 6:
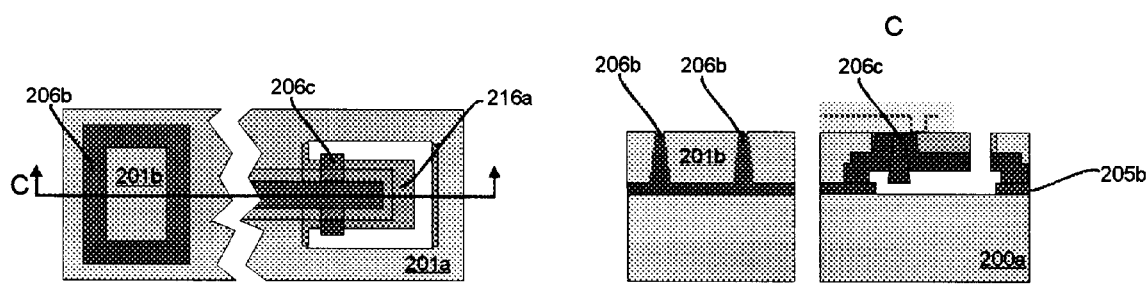
FIG. 6 is a plan- and cross-sectional view of a bonded wafer pair after structural definition with a trench-isolated region and a mechanical structure free from the handle wafer formed in the same device substrate in accordance with the invention.

The method described above also provides for formation of structural elements in the same device substrate as electrically isolated regions that are firmly attached to the handle substrate. Isolation of regions of the device substrate attached to the handle substrate may be provided for when the device 201a and handle substrates 200a are bonded with a layer of insulating dielectric 205b between or part of at least one of the substrates, and filled trenches 206b are formed outside regions where a cavity is etched into the first surface of the device substrate during the cavity etch. For example, referring to FIG. 6, the isolated regions 201b are laterally isolated from the remainder of the device substrate 201a by a filled isolation trench 206b, and are vertically isolated from the handle substrate 200a by the layer of the deposited or grown dielectric material 205b. Note the method provides for simultaneous formation of electrically isolated mechanical structures 216a with isolation trenches 206c that are mechanically free from the underlying handle substrate. Co-location of mechanical structures that are free from the handle substrate on the same device substrate as electrically isolated regions attached to the handle substrate may be advantageous in cases when it is desirable to have particular regions of circuitry isolated from one another, including: mixed signal circuits with an analog and a digital component; there are sensitive portions of an analog circuit, for example a voltage reference; isolation of the collector from the substrate in a bipolar transistor formed in a CMOS circuit technology; and decoupling of circuit power and ground, allowing for the use of two or more independent power supplies.

Figure 7:
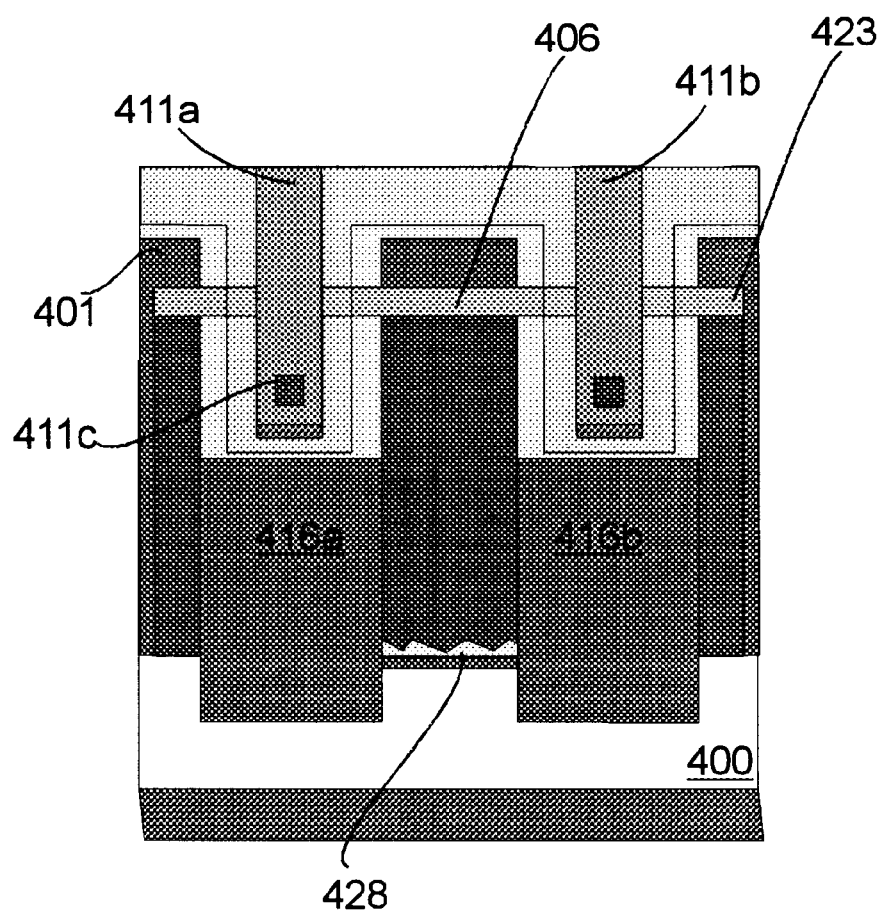
FIG. 7 is a perspective cut-away view of one region in which stringers may form.

Because of restrictions of processing technology, including RIE, a potential exists for electrical conduction between mechanical structures intended to be isolated. One method by which electrical conduction may occur is through conductive "stringers" 428 (FIG. 7) located along the wall of the isolation trench. A stringer is defined as undesirable material left behind after etching. An example of a stringer is shown in FIG. 7. Use of a tapered trench profile such as shown in FIG. 1C may help minimize stringer formation. Further elimination of stringers may be provided by ensuring isolation trenches extend into a region cleared during the structural-definition etch at each point where isolation is desired. A protrusion of a trench into such a region is termed a "nubbin" 423. By ensuring that every isolation trench 106, 206, 306 terminates in a region 115,215,315 cleared during the structural-definition etch (i.e. every trench ends with a nubbin), three faces of the trench are exposed to the etch. Increased exposure to the structural-definition etch reduces incidence of stringers and results improved isolation characteristics of the device. Furthermore, trench fill materials attacked by the second deep etch may be selected, including silicon nitride and silicon dioxide, resulting in etching of the nubbins 423.

Because trenches 103 typically have a large height-to-width aspect-ratio, trenches may have keyholes 427 after filling. A keyhole is produced when the trench-fill material plugs the exposed entrance to a trench before enough material may be deposited to completely fill the center region of the trench. Keyhole formation is undesirable because keyholes may significantly reduce the mechanical strength and reliability of the trench. Use of a tapered trench profile such as shown in FIG. 1C may help minimize keyhole formation. When the trench-fill deposition is substantially isotropic (such as LPCVD silicon nitride or TEOS silicon dioxide) keyhole formation may be further reduced using condyles, which are areas along the length of the filled trenches with an increased width. Condyles reduce keyholing by enabling trench-fill material to travel down and laterally into the keyhole. FIG. 8A, 8B–C show plan and cross-sectional views of a trench 403a and a condyle 403b before dielectric insulating material 405 is deposited. FIG. 9 shows the formation of lips 429 at the top of the trench which eventually pinch-off the trench entrance as shown in FIG. 10. Once the lips pinch-off further deposition of material inside the trench from the top is prevented. Since the cross-sectional area of the condyle is greater than the cross sectional area of the trench the condyle enables further deposition of material by lateral migration until the lips at the top of the condyle pinch-off, shown in FIG. 11. Examples of filled condyles 424a–f attached to filled trenches 406 are shown in FIG. 12A–F. To prevent keyholes along the length of a trench, small regions of a trench may be chosen to have an increased width. Note that condyles may be formed at one or both ends of a trench, along the length of a trench including one or more ends, or along the length of a trench not including the ends, as illustrated in FIG. 12A–F. Condyle shapes are not limited to the examples shown, many shapes with an effective cross-sectional width greater than the nominal trench width may serve as a condyle.

Figure 13:
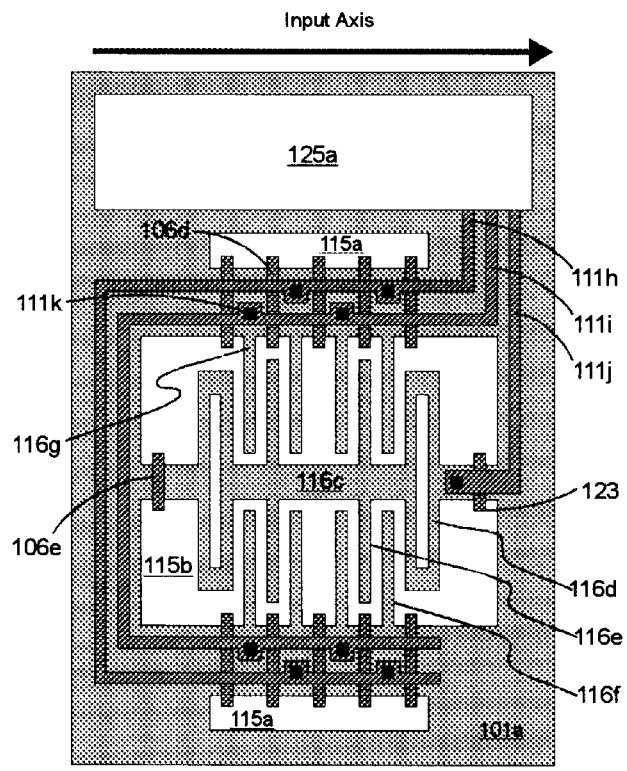
FIG. 13 is a plan view of a substantially planar device with multiple mechanical structures and multiple interconnects integrated with circuitry.

As a first example of a device fabricated in accordance with the present invention, FIG. 13 illustrates an accelerometer that measures translational acceleration along an input axis. However, the principles of the invention are applicable to many other devices including, but not limited to: gyroscopes; angular accelerometers; mechanical filters; resonators or oscillators; mechanical valves; actuators, such as disk-drive head actuators; and passive mechanical structures such as gimbals.

The illustrated accelerometer built in device substrate 101a includes a proof-mass 116c, stationary interdigitated comb fingers 116f,g CMOS electronic circuitry 125a, and electrical interconnect 111h,i,j. Electrical contact from the interconnect to the mechanical structures are made with contacts 111k, which are, in this example, substrate contacts formed during CMOS circuit processing. The proof-mass 116c is defined by removal of regions of excess device substrate material 101a leaving open area 115b. The proof-mass includes a flexure 116d that allows the proofmass to deflect, and comb-fingers 116e that are interleaved with stationary comb-fingers 116f,g. Proof-mass comb-fingers 116e form the center node of a capacitive half-bridge with stationary comb-fingers 116f,g. Deflections of the proof-mass from translational accelerations along the input axis result in an imbalance in the half-bridge. Electronic circuitry 125a may measure this imbalance to infer acceleration. Furthermore, electronic circuitry 125a may force-balance the proof-mass using electrostatic attraction between comb-fingers 116e and 116f,g or one or more separate sets of comb-fingers. Many of the mechanical elements such as the proof-mass 116c and the stationary, interdigitated comb-fingers 116f,g are electrically isolated from each other, the circuitry, and the remainder of the substrate by a combination of regions 115a,b formed during the structural-definition etch, and a set of filled isolation trenches 106d,e with nubbins 123. Optional condyles may be added for improved trench filling.

Figure 14:
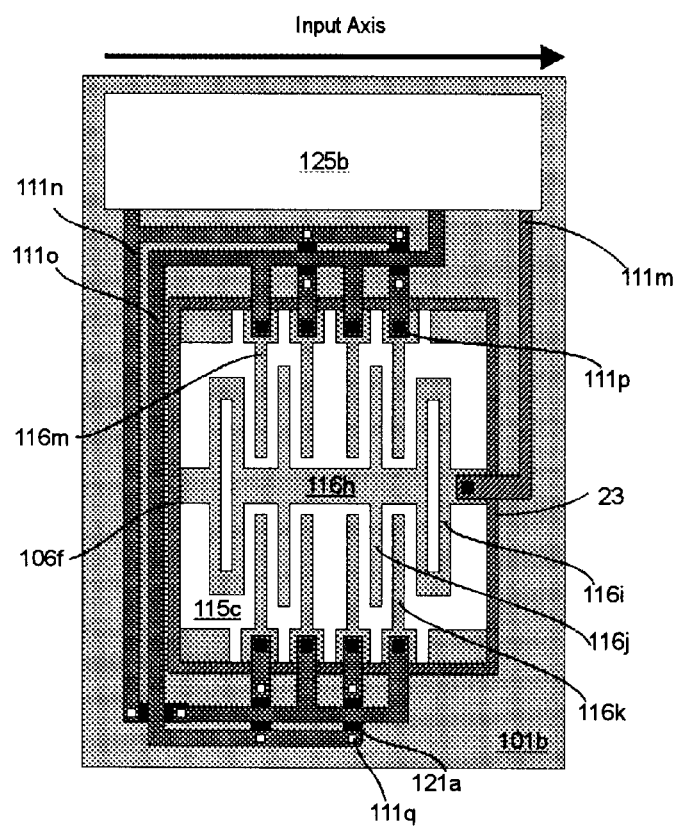
FIG. 14 is a plan view of a second substantially planar device with multiple mechanical structures and multiple interconnects integrated with circuitry.

As an alternative example of a device fabricated in accordance with the present invention, FIG. 14 illustrates an accelerometer that measures translational acceleration having a single isolation trench 106f. The illustrated accelerometer built in device substrate 101b includes a proof-mass 116h, stationary interdigitated comb fingers 116k,m CMOS electronic circuitry 125b, and a first layer of conductive electrical interconnect 111*m,n,o*. Electrical contact from the first layer of interconnect to the mechanical structures are made with contacts 111*p*, which are, in this example, substrate contacts formed during CMOS circuit processing. A second layer of conductive interconnect 121*a* may be used for routing of electrical signals and is connected to the first layer of conductive interconnect by contacts 111*q*. The proof-mass 116*h* is defined by removal of regions of excess device substrate material 101*b* leaving open area 115*c*. The proof-mass includes a flexure 116*i* that allows the proof-mass to deflect, and comb-fingers 116*j* that are interleaved with stationary comb-fingers 116*k,m*. Proof-mass comb-fingers 116*j* form the center node of a capacitive half-bridge with stationary comb-fingers 116*k,m*. Deflections of the proof-mass from translational accelerations along the input axis result in an imbalance in the half-bridge. Electronic circuitry 125*b* may measure this imbalance to infer acceleration. Furthermore, electronic circuitry 125*b* may force-balance the proof-mass using electrostatic attraction between comb-fingers 116*j* and 116*k,m* or one or more separate sets of comb-fingers. Many of the mechanical elements such as the proof-mass and the stationary, inter-digitated comb-fingers are electrically isolated from each other, the circuitry, and the remainder of the substrate by a combination of regions 115*c* formed during the structural definition etch, and a filled isolation trench 106*f* that encloses a region in which mechanical structures are defined. Optional condyles may be added for improved trench filling.

Accelerometer performance is enhanced over prior-art implementations due to the high-aspect-ratio fabrication that yields larger mass, air-gap capacitors with larger sensitivity, and improved suppression of undesired deflections out of the plane of the device substrate. Fabrication of accelerometers in accordance with the invention provides mechanical structures mechanically free from the handle substrate without a wet release step, increasing yield and decreasing processing complexity. Fabrication of accelerometers in accordance with the invention provides for substantially voidless isolation trench fill while maintaining good electrical isolation across isolation trenches. Isolation may be enhanced when the trenches use either nubbins or a tapered trench profile as shown in FIG. 1C. In addition, lower parasitic capacitances in proportion to active sense capacitance than prior art inventions may be formed between the mechanical structures and the device substrate since the invention allows for the use of lower dielectric constant isolation materials than prior art solutions. The co-fabrication of circuits on the device substrate with the mechanical device further enhances performance due to the proximity of interface circuitry. Furthermore, use of metal interconnect results in a lowered parasitic interconnect resistance over prior-art solutions translating to a lower thermal noise inherent to the sensor.

The foregoing description, for the purposes of explanation, used specific nomenclature to provide a thorough understanding of the invention. However, it will be apparent to one skilled in the art that the specific details are not required in order to practice the invention. Thus, the foregoing descriptions of specific embodiments of the invention are presented for the purposes of illustration and description. They are not intended to be exhaustive or to limit the invention to the precise forms disclosed, obviously many modifications and variations are possible in view of the above teachings. For example, a trench may extend through the device substrate such that only a portion of the trench is disposed above a cavity; trenches may be various shapes, including a U, for example; and trenches may include curves or bends as viewed from perspective view. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A micromechanical device comprising:
   a device substrate having a first surface, a second surface, and a semiconductor layer;
   a handle substrate having a first surface and a second surface, the first surface of the device substrate bonded to the first surface of the handle substrate;
   at least a first trench formed in the device substrate, said at least first trench extending from the second surface of the device substrate through the device substrate towards the handle substrate;
   a dielectric within the first trenches;
   at least one cavity formed in at least one of said substrates and disposed below the second surface of the device substrate, said cavity enclosing at least a portion of said at least one first trench;
   at least a second trench formed in the second surface of the device substrate, the at least second trench defining at least one micromechanical device.

2. The device of claim 1, further including:
   a dielectric formed upon the second surface of the device substrate, the dielectric including at least one exposed contact region exposing the second surface of the device substrate;
   at least one electrical conductor, the electrical conductor interconnecting at least one micromechanical device through said at least one contact region.

3. The device of claim 1, further including circuitry formed in the second surface of the device layer, the circuitry including at least one transistor.

4. The device of claim 2 wherein the electrical conductor defines an interconnection over at least one first trench.

5. The device of claim 1, additionally including circuitry formed upon a micromechanical structure defined by the second trench.

6. The device of claim 1 wherein the handle substrate comprises a wafer of material chosen from at least one of: silicon, silicon dioxide on silicon, silicon nitride on silicon, quartz, glass, and aluminum oxide.

7. The device of claim 1 wherein the device substrate comprises a wafer of material chosen from at least one of: undoped silicon, p-type silicon, n-type silicon, silicon having a thin layer of heavily p-doped silicon on the first surface of the device layer, and silicon having a thin layer of heavily n-doped silicon on the first surface of the device layer.

8. The device of claim 1 wherein the dielectric comprises a material chosen from at least one of: deposited silicon dioxide, TEOS oxide, silicon nitride, phosphosilicate glass, arsenic glass, boron glass, boro-phosphosilicate glass, grown silicon dioxide.

9. The device of claim 1 wherein said at least one first trench extends into said at least second trench thereby forming a nubbin.

10. The device of claim 1 wherein said at least one first trench contains one or more condyles.

11. The device of claim 1 wherein the dielectric substantially fills said at least first trench.

12. The device of claim 1 further including a second material formed on the dielectric, the second material substantially filling each first trench.

13. The device of claim 12 wherein said second material includes polysilicon.

14. The device of claim 1, further including one or more studs.

15. The device of claim 1, wherein the cavity disposed below the second surface of the device layer is formed into the first surface of the device layer.

16. The device of claim 1, wherein the cavity disposed below the second surface of the device layer is formed into the first surface of the handle layer.

17. The device of claim 1 wherein the first surface of the device substrate is anodic-bonded to the first surface of the handle substrate.

18. The device of claim 1 wherein the first surface of the device substrate is fusion-bonded to the first surface of the handle substrate.

19. The device of claim 1 further including a layer of silicon dioxide at the bond interface between the first surface of the device substrate and the first surface of the handle substrate.

20. The device of claim 1 wherein said first trench is tapered toward said second surface.

21. A device, comprising:
   a device wafer having a first surface and a second surface;
   a handle wafer bonded to said device wafer at said first surface;
   at least a first trench formed in the device substrate having a taper toward said second surface;
   an insulator in said first trench;
   at least one cavity formed in at least one of said wafers between said device wafer and said handle wafer: and
   at least a second trench formed in said device wafer defining at least one micromechanical device.

22. The device of claim 21 wherein said insulator is silicon dioxide.

23. A device, comprising:
   a device wafer having a first surface and a second surface;
   a handle wafer having a first surface bonded to said device wafer device wafer at said first surface of said device wafer;
   at least a first trench formed in the first surface of said device substrate and extending from said first surface through toward said second surface;
   a silicon dioxide insulator substantially occupying said first trench;
   at least one cavity formed in at least one of said wafers between said device wafer and said handle wafer; and
   at least a second trench formed in said device wafer defining at least one micromechanical device.

* * * * *